United States Patent
Sebe et al.

(10) Patent No.: US 8,875,866 B2
(45) Date of Patent: Nov. 4, 2014

(54) ARTICLE TRANSPORT FACILITY

(71) Applicant: Daifuku Co., Ltd., Osaka (JP)

(72) Inventors: Takahiro Sebe, Komaki (JP); Yuji Baba, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 13/750,170

(22) Filed: Jan. 25, 2013

(65) Prior Publication Data

US 2014/0034449 A1    Feb. 6, 2014

(30) Foreign Application Priority Data

Jan. 27, 2012 (JP) ................... 2012-015768

(51) Int. Cl.
*B65G 43/08* (2006.01)
*H01L 21/677* (2006.01)
*B65G 47/61* (2006.01)

(52) U.S. Cl.
CPC .......... *B65G 47/61* (2013.01); *H01L 21/67775* (2013.01); *H01L 21/67733* (2013.01); *H01L 21/67769* (2013.01); *H01L 21/67736* (2013.01)
USPC ............... 198/346.3; 414/222.11; 414/222.07

(58) Field of Classification Search
USPC ............ 198/346.3, 465.4, 678.1; 414/222.11, 414/222.07, 225.01, 673
See application file for complete search history.

(56) References Cited

U.S. PATENT DOCUMENTS

| | | | | |
|---|---|---|---|---|
| 3,770,150 A | * | 11/1973 | Clark | 414/564 |
| 6,889,813 B1 | * | 5/2005 | Trammell et al. | 198/346.3 |
| 8,047,762 B2 | * | 11/2011 | Zimmerhackl et al. | 414/222.07 |
| 8,522,953 B2 | * | 9/2013 | Iwamoto | 198/345.1 |
| 2003/0075415 A1 | * | 4/2003 | Ito | 198/346.3 |
| 2008/0056860 A1 | | 3/2008 | Natume | |
| 2009/0016859 A1 | * | 1/2009 | Asakawa | 414/222.11 |
| 2010/0014948 A1 | * | 1/2010 | Higashida | 414/222.05 |
| 2010/0068013 A1 | | 3/2010 | Mizokawa et al. | |
| 2010/0204826 A1 | * | 8/2010 | Sawado et al. | 414/222.07 |
| 2010/0215461 A1 | | 8/2010 | Kamikawa et al. | |
| 2011/0222994 A1 | * | 9/2011 | Inagaki et al. | 414/222.07 |

FOREIGN PATENT DOCUMENTS

| | | |
|---|---|---|
| JP | 2003168714 A | 6/2003 |
| JP | 200853596 A | 3/2008 |
| JP | 2008244416 A | 10/2008 |
| JP | 2009173396 A | 8/2009 |
| JP | 2010192855 A | 9/2010 |
| WO | 0037338 A1 | 6/2000 |

* cited by examiner

*Primary Examiner* — James R Bidwell
(74) *Attorney, Agent, or Firm* — The Webb Law Firm

(57) ABSTRACT

A ceiling transport carriage transfers an article at a first supporting position and receives the article from second supporting position in an article transfer section, in association with hoisting operations of a support unit. A ground transport device transports the article between the above two positions and a processing position where an article processing device effects a processing or operation on the article. The respective positions above are set in tandem in the article transfer section along a tandem direction along which the article processing device and the article transfer section are disposed in tandem. The ceiling transport carriage includes a movement operating mechanism for operating and moving a support unit along the tandem direction, to a position immediately above the first supporting position and to a position immediately above second supporting position.

12 Claims, 7 Drawing Sheets

ARTICLE TRANSPORT FACILITY

FIELD OF THE INVENTION

The present invention relates to an article transport facility including a ceiling (overhead) transport carriage having a hoistable support unit and provided on the ceiling side, an article transfer section provided on the ground side, and a ground transport device for transporting an article between the article transfer section and an article processing device.

BACKGROUND

Japanese Unexamined Patent Application Publication No. 2008-244416 discloses an article transport facility configured as follows. A first supporting position and a second supporting position are set in tandem along a traveling path of a ceiling transport carriage in an article transfer section. When the ceiling transport carriage makes a stop at a position corresponding to the first supporting position, the carriage transfers an article to the first supporting position. When the ceiling transport carriage makes a stop at a position corresponding to the second supporting position, the carriage receives the article from the second supporting position.

With this article transport facility, in the article transfer section, the first supporting position and the second supporting position are set in tandem along the traveling path of the ceiling transport carriage. And, after the ceiling transport carriage, when stopped at the position corresponding to the first supporting position, transfers the article, this ceiling transport carriage is moved to the position corresponding to the second supporting position to receive the article from the second supporting position. In this way, according to the above configuration of the conventional article transport facility, after the ceiling transport carriage transfers an article to the article transfer section, this ceiling transport carriage can receive the article from the article transfer section.

SUMMARY OF THE INVENTION

However, in the case of the arrangement wherein the first supporting position and the second supporting position are set in tandem along the traveling path of the ceiling transport carriage, the article transfer section tends to have a significant length in the path longitudinal direction along the traveling path. For instance, if e.g. an article transfer section is provided for each one of plurality of article processing devices disposed in tandem in the path longitudinal direction, it is necessary to provide also a plurality of article transfer sections along the path longitudinal direction. In this case, if each article transfer section has a considerable length along the path longitudinal direction, it becomes difficult to secure space for their installment.

In view of the above-described state of the art, there is a need for an article transport facility with which the installment space of the article transfer section can be readily secured, with retaining the ability of causing the ceiling transport carriage to receive an article from the article transfer section after causing the carriage to transfer the article to the article transfer section.

According to the characterizing feature of an article transport facility proposed by the present invention in view of the above-described background, the article transport facility comprises:

a ceiling transport carriage that can travel along a traveling path while being guided and supported by a traveling rail disposed on the ceiling side, the ceiling transport carriage including a support unit hoistable with supporting an article;

an article transfer section provided on the floor side in the vicinity of an article processing device for effecting a prescribed process on the article;

the traveling path for the ceiling transport carriage being disposed, upwardly of the article transfer section, along a path longitudinal direction that intersects a tandem direction along which the article processing device and the article transfer section are disposed in tandem; the ceiling transport carriage transfers an article to the first supporting position of the article transfer section in association with a hoisting of the supporting unit and receives the article from the second supporting position of the article transfer section in association with a hoisting of the supporting unit; and a ground transport device for transporting the article between a processing position where the article processing device effects the processing on the article and the first supporting position as well as between the processing position and the second supporting position;

wherein the first supporting position, the second supporting position and the processing position are set in tandem along the tandem direction in the article transfer section; and the ceiling transport carriage includes a movement operating mechanism for operating movement of the support unit to a position immediately above the first supporting position and to a position immediately above second supporting position, along the tandem direction.

With the above-described arrangement, when the ceiling transport carriage is kept still at a position corresponding to the article transfer section and after the support unit is moved by the movement operating mechanism to the position immediately above the first supporting position, with a hoisting operation of the support unit, an article can be transferred to the first supporting position of the article transfer section. Further, when the ceiling transport carriage is kept still at a position corresponding to the article transfer section and after the support unit is moved by the movement operating mechanism to the position immediately above the second supporting position, with a hoisting operation of the support unit, an article can be transferred (received) from the second supporting position of the article transfer section. In this manner, after an article is transferred to an article transfer section by the ceiling transport carriage, the article can be transferred (received) from the article transfer section by this ceiling transport carriage.

And, the first supporting position, the second supporting position and the processing position are set in tandem in the article transfer section along the direction along which the article processing device and the article transfer section are disposed in tandem. As this tandem direction is a path lateral width direction intersecting (transverse to) the path longitudinal direction, the length of the article transfer section along the path longitudinal direction can be short. For instance, in the case of the arrangement wherein the article transfer sections are provided for respective article processing devices which are disposed in tandem along the path longitudinal direction, the article transfer sections too need to be provided in plurality in tandem along the path longitudinal direction. In implementing this, with the inventive arrangement described above, as each article transfer section can be formed short along the path longitudinal direction, installment space of the article transfer sections can be readily secured.

Next, various embodiments of the present invention will be described. According to one preferred embodiment of the article transport facility relating to the present invention, a plurality of the article transfer sections are disposed in tandem along the path longitudinal direction. For instance, in case a plurality of article processing devices are disposed in tandem along the path longitudinal direction and the article transfer sections are to be provided for these respective plural article processing devices, or in case a plurality of the article transfer sections are to be provided for an article processing device, the plurality of article transfer sections too need to be provided in tandem along the path longitudinal direction. According to the above-described arrangement, as the article transfer section can be formed short along the path longitudinal direction, installment space of the article transfer section can be readily secured.

According to a further preferred embodiment of the article transport facility relating to the present invention, the facility further comprises a controller for controlling operations of the ceiling transport carriage and the ground transport device;

the first supporting position is set between the processing position and the second supporting position along the tandem direction; and the controller controls the operation of the ceiling transport carriage and the ground transport device such that:

the ceiling transport carriage transfers an article to the first supporting position, after which the ground transport device transports this article from the first supporting position to the processing position and the ceiling transport carriage receives an article at the second supporting position, and after which the ground transport device transports an article after the processing thereof at the processing position from this processing position to the second supporting position.

That is, along the tandem direction, between the processing position and the second supporting position, the first supporting position is set. Hence, even when an article is currently located at the second supporting position, this article can be transported from the first supporting position to the processing position by the ground transport device. Namely, after the ceiling transport carriage transfers an article to the first supporting position and before this ceiling transport carriage receives the article from the second supporting position, the ground transport device can start transport of the article of the first supporting position toward the processing position. Therefore, the transferring operations of the article by the ceiling transport carriage and the transporting operation of the article by the ground transport device can proceed in an efficient manner.

According to a still further preferred embodiment of the article transport facility relating to the present invention, the ground transport device includes a processing-side transport deck configured to mount and support thereon a portion of the bottom face of the article and to move under this condition along the tandem direction for transporting the article between the processing position and the first supporting position and a transferring-side transport deck configured to mount and support thereon another portion of the bottom face of the article not mounted or supported by the processing-side transport deck and to move under this condition along the tandem direction for transporting the article between the first supporting position and the second supporting position; and as the processing-side transport deck and the transferring-side transport deck are hoisted relative to each other, the article is transferred between the processing-side transport deck and the transferring-side transport deck.

With the above-described arrangement, while the article is mounted and supported by the transferring-side transport deck and located at the second supporting position, the article transferred by the ceiling transport carriage to the first supporting position can be mounted and supported by the processing-side transport deck. Further, this article can be transported to the processing position by the processing-side transport deck. And, after the ceiling transport carriage receives the article at the second supporting position, the processing-side transport deck is caused to transport the article from the processing position to the first supporting position, and while the processing-side transport deck and the transferring-side transport deck are located at the first supporting position, the transferring-side transport deck is moved upward relative to the processing-side transport deck, so that the article can be transferred from the processing-side transport deck to the transferring side transport deck and then transported by this transferring-side transport deck from the first supporting position to the second supporting position. Therefore, as the decks for supporting an article, the above arrangement requires only the processing-side transport deck and the transferring-side transport deck. Hence, in comparison with an exemplary arrangement wherein there are provided fixed supporting decks for supporting an article at the first supporting position and the second supporting position, respectively, as well as a transport deck for transporting the article from the fixed supporting deck at the first supporting deck to the processing position and a further transport deck for transporting the article from the processing position to the fixed supporting deck at the second supporting position, the configuration of the ground transport device can be simple.

According to a still further preferred embodiment of the article transport facility relating to the present invention, the article comprises a substrate storage container capable of storing a plurality of substrates therein and having a detachable lid for closing a substrate carry in/out opening;

the processing position is a position for effecting an opening/closing operation of the lid of the substrate storage container and a carry in/out operation of the substrate relative to the substrate storage container.

With the above-described arrangement, after the ceiling transport carriage transfers a substrate storage container to the article transfer section, this ceiling transport carriage can receive the article from the article transfer section. Further, the length of the article transfer section along the path longitudinal direction can be short. Therefore, even when e.g. a plurality of article processing devices for effecting the opening/closing operation of the lid and the carry in/out operation of the substrate are disposed in tandem along the path longitudinal direction and the article transfer sections are provided for these respective article processing devices, as each article transfer section can be formed short in the path longitudinal direction, the installment space for the article transfer sections can be readily secured.

DETAILED DESCRIPTION

Figure 1:
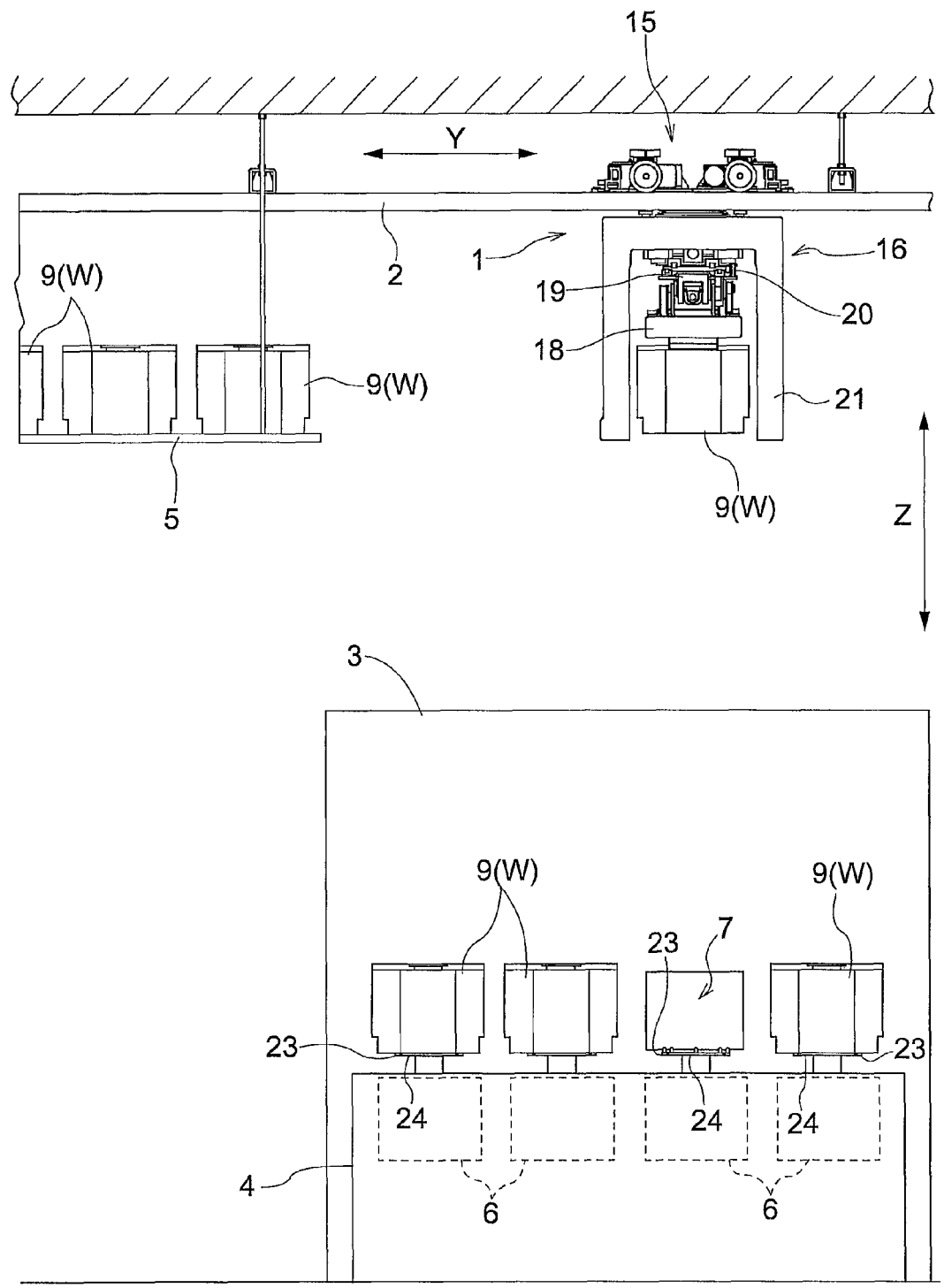
FIG. 1 is a lateral side view showing an article transport facility.

Next, embodiments of the present invention will be described with reference to the accompanying drawings. As shown in FIGS. 1-4, an article transport facility includes a ceiling transport carriage 1 that can travel along a traveling path while being guided and supported by a traveling rail 2 mounted on the ceiling side, a container transfer section 4 as an article transfer section disposed on the floor side in the vicinity of a processing device 3 as an article processing device for effecting a prescribed process on an article W (a prescribed process), and a storage shelf 5 suspended from the ceiling and capable of storing a plurality of articles W. Incidentally, in some parts of the following discussion, the direction along the traveling path will be referred to as the path longitudinal direction Y and the direction intersecting the fore/aft direction (the path longitudinal direction Y) at a right angle will be referred to as the path lateral width direction X, respectively.

Figure 2:
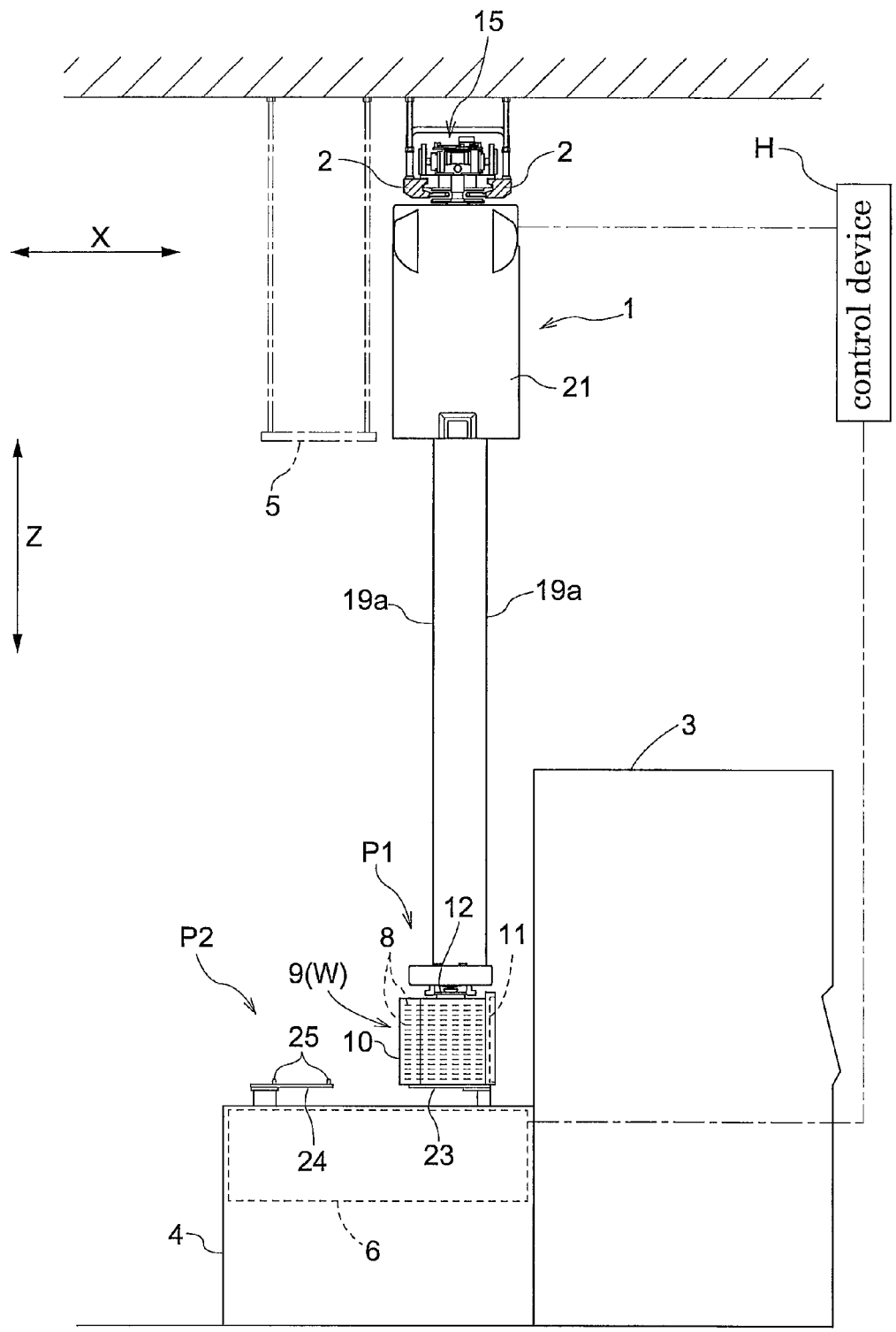
FIG. 2 is a front view showing a condition wherein a ceiling transport carriage transfers an article to a first supporting position.

As shown in FIG. 2, the article W is a substrate storage container 9 capable of storing a plurality of substrates 8 therein and having a detachable lid 11 for closing a carry in/out opening for the substrates 8. In the instant embodiment, the substrate 8 is a semiconductor wafer, and a FOUP (Front Opening Unified Pod) constitutes the substrate storage container 9. The processing device 3 is a device for effecting various processes or operations such as inspection, machining, etc. on the substrates 8 stored in the substrate storage container 9. Hence, the "prescribed process" can be e.g. an inspection process or a machining process.

The substrate storage container 9 includes a casing 10 having an opening for carrying in/out the substrates 8 and the attachable/detachable lid 11 for closing the opening of the casing 10. On the top face of the casing 10, there is formed a top flange 12 which is to be supported by a support mechanism 18 ("a support unit") of the ceiling transport carriage 1. In the bottom face of the casing 10, there are formed engaged portions 13 (see FIG. 6A, etc.) to which positioning projections 25 of a ground transport device 6 provided in the container transfer section 4 come into engagement.

The processing device 3 is configured to effect various processings or operations such as opening/closing operations of the lid 11 of the substrate storage container 9, carry in/out operations of the substrates 8 to/from the substrate storage container 9, and machining, cleaning operations, etc. on the carried-out substrate 8, thus effecting processings (or operations) on the substrate storage container 9 and the substrates 8 carried out therefrom. This processing device 3, as shown in FIG. 1, is provided in plurality and are disposed such that their processing openings 7 for opening/closing the lids 11 of the substrate storage containers 9 as being disposed in close vicinity with each other and carrying in/out the substrates 8 relative thereto are arranged in tandem along the path longitudinal direction Y. For each of the processing openings 4, a container transfer section 4 is provided and this container transfer section 4 is provided in plurality in tandem along the path longitudinal direction Y.

[Ceiling Transport Carriage]

Figure 3:
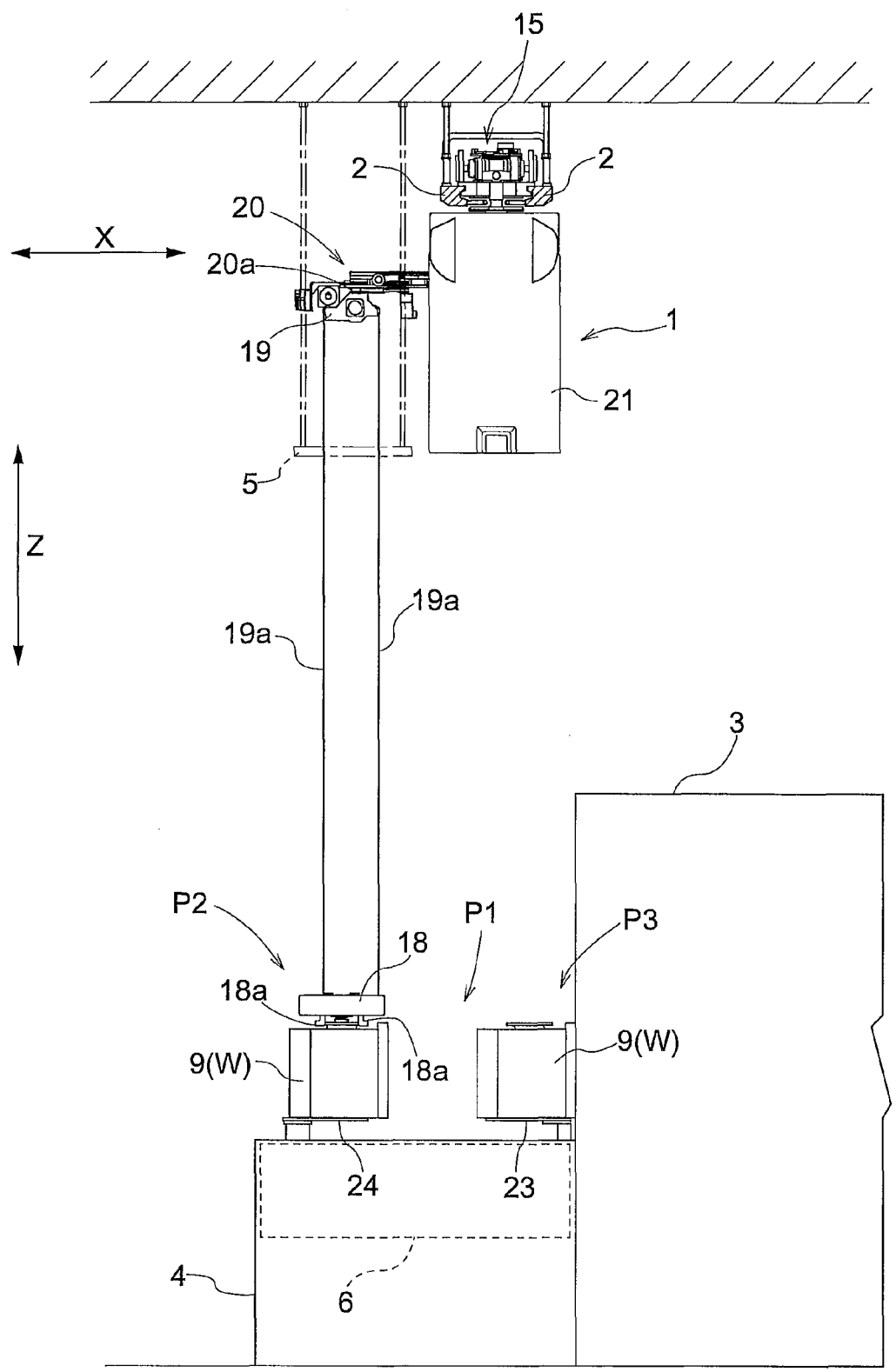
FIG. 3 is a front view showing a condition wherein the ceiling transport carriage receives an article from a second supporting position.
Figure 4:
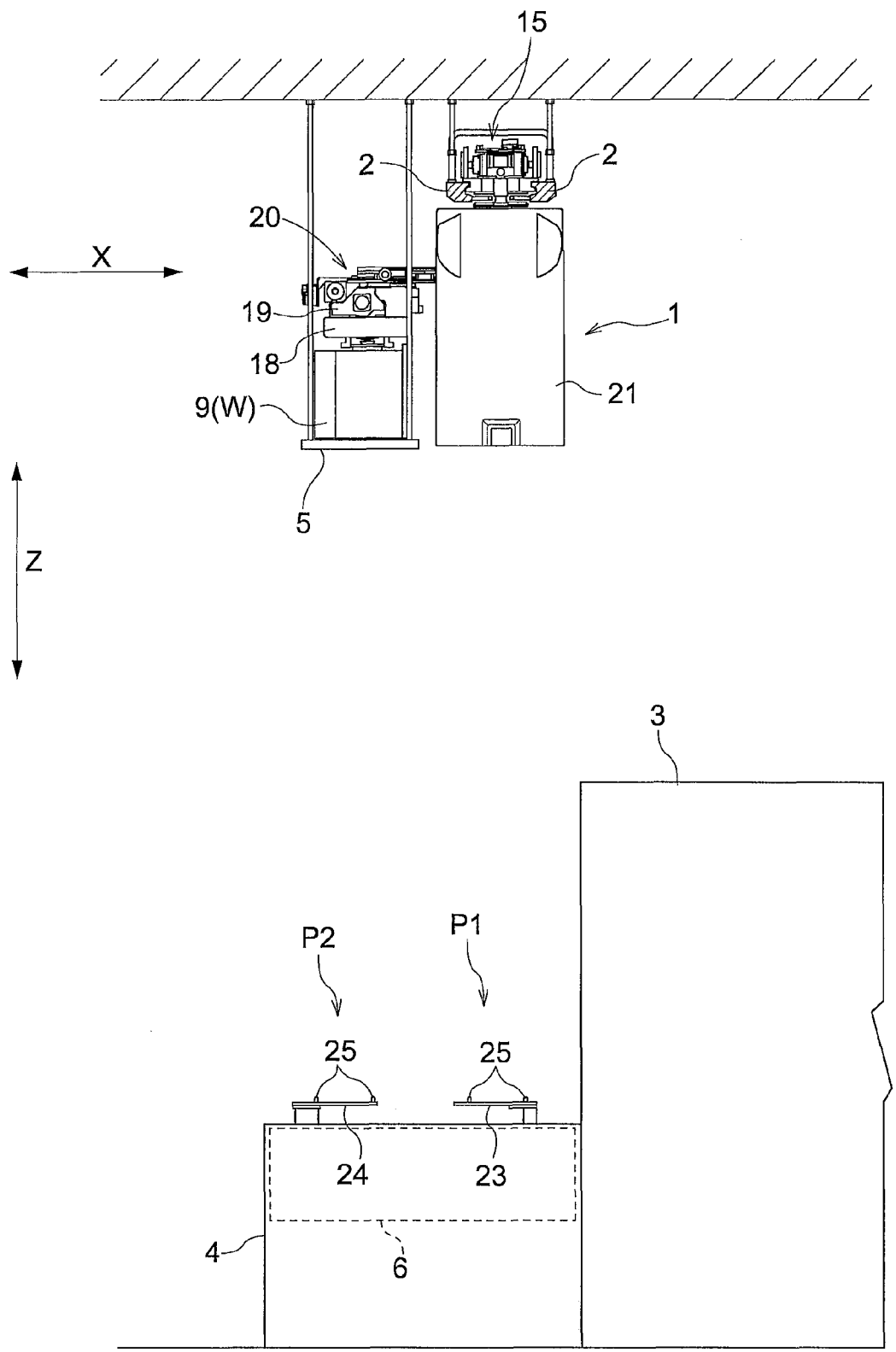
FIG. 4 is a front view showing a condition wherein the ceiling transport carriage transfers an article to/from a storage shelf.

As shown in FIGS. 2-4, the ceiling transport carriage 1 includes the aforementioned support mechanism 18 (the "support unit") for supporting the article, with the support mechanism 18 being hoistable. More particularly, the ceiling transport carriage 1 is configured such that in association with a hoisting of the support mechanism 18, the substrate storage container 9 can be transferred to a first supporting position P1 of the container transfer section 4, and in association with a hoisting of the support mechanism 18, the substrate storage container 9 can be received from a second supporting position P2 of the container transfer section 4. Incidentally, in some parts of the following discussion, the direction along the hoisting direction of the support mechanism 18 will be referred to as a hoisting direction Z. This hoisting direction Z is a direction substantially perpendicular to the above-described path longitudinal direction Y and the path lateral width direction X.

As shown in FIG. 1, the ceiling transport carriage 1 includes a traveling unit 15 which travels on the traveling rail 2 along the traveling path, and a main body portion 16 which hoistably supports the substrate storage container 9. The main body portion 16 includes the support mechanism 18 as the support unit for supporting the article W, a host operating mechanism 19 for hoisting the support mechanism 18, a slide operating mechanism 20 as a movement operating mechanism for causing the hoist operating mechanism 19 and the support mechanism 18 to be slid to a retracted position immediately below the traveling unit 15 and a projecting position offset relative to the traveling unit 15 along the path lateral width direction X, and a cover body 21 for covering the upper side and the path-wise front and rear sides of the substrate storage container 9 as being supported by the support mechanism 18.

The support mechanism 18 includes a pair of gripping claws 18a pivotable about a horizontal axis. Each of the pair of gripping claws 18a is switchable in its posture between a gripping posture for gripping the top flange 12 of the substrate storage container 9 and a releasing posture for releasing the gripping to the top flange 12. The hoist operating mechanism 19 includes a length of take-up belt 19a connecting and supporting, at the leading end thereof, the support mechanism 18, with the take-up belt 19a being freely taken up or paid out. In operation, in association with a take-up or paying-out operation of the take-up belt 19a, the support mechanism 18 and the substrate storage container 9 supported thereto can be hoisted, i.e. vertically moved.

As shown in FIGS. 2-4, the slide operating mechanism 20 includes a supporting body 20a connected to and supporting the hoist operating mechanism 19 so that the supporting body 20a can be slid along the path lateral width direction X. More particularly, in association with the sliding movement of the supporting body 20a along the path lateral width direction X, the support mechanism 18 and the substrate storage container 9 supported thereto can be moved to the retracted position immediately below the traveling rail 2 and immediately above the first supporting position P1 (see FIG. 2) and to the projecting position (see FIG. 3 and FIG. 4) located on one side of the path lateral width direction X relative to the traveling rail 2 and immediately above the second supporting position P2. In this way, the slide operating mechanism 20 is configured to move the support mechanism 18 along the path lateral width direction X to the position immediately above the first supporting position P1 or to the position immediately above the second supporting position P2.

The traveling path of the ceiling transport carriage 1 is set along the path longitudinal direction Y that intersects the path lateral width direction X ("tandem direction") along which the processing device 3 and the container transfer section 4 are disposed in tandem over the container transfer section 4. The traveling path (traveling rail 2) of the ceiling transport carriage 1 is located immediately above the first supporting position P1 in the storage transfer section 4. Incidentally, when the ceiling transport carriage 1 is to travel/move, there is provided a traveling state wherein the take-up belt 19a is taken up and the supporting body 20a is slid to the retracted position. Further, in this traveling state, when the substrate storage container 9 is to be transported, the gripping claws 18a are set to the gripping posture for gripping this substrate storage container 9. Whereas, when the substrate storage container 9 is not to be transported, the gripping claws 18a are set to the releasing posture.

As shown in FIG. 2, operations of the ceiling transport carriage 1 are controlled by a control device H as "a controller". The control device H is configured to control the operations of the ceiling transport carriage 1 in order to effect a transfer operation for transferring the substrate storage container 9 to the first supporting position P1 and a receiving operation for receiving the substrate storage container 9 from the second supporting position P2. In the transfer operation, as shown in FIG. 2, the ceiling transport carriage 1 is stopped at a stop position corresponding to the container transfer section 4. Then, under this condition, the take-up belt 19a is paid out and the gripping claws 18a are switched over in their posture to the releasing posture, so that the substrate storage container 9 is transferred to the first supporting position P1 and then the take-up belt 19a is taken up. And, in the receiving operation, as shown in FIG. 3, the ceiling transport carriage 1 is stopped at a stop position not corresponding to the container transfer section 4. Then, under this condition, the supporting body 20a is slid to the projecting position and the take-up belt 19a is paid out, after which the gripping claws 18a are switched over in their posture to the gripping posture, so that the substrate storage container 9 is received from the second supporting position P2. Thereafter, the take-up belt 19a is taken up and the supporting body 20a is slid to the retracted position.

Further, the control device H1 is configured to control the operations of the ceiling transport carriage 1 in order to effect a storing operation for carrying the substrate storage container 9 into the storage shelf 5 and a carry-out operation for carrying out the substrate storage container 9 from the storage shelf 5. In the carrying-out operation, as shown in FIG. 4, this operation is same as the above-described receiving operation, except that in the carrying-in operation, the ceiling transport carriage 1 is kept stopped at a stop position corresponding to a storage position of the storage shaft 5 and the paying-out amount and the taking-up amount of the take-up belt 19a are different from those of the latter operation. Also, the storing operation is effected by effecting the carrying-out operation in the revere procedure. Further, the container transfer section 4 and the storage shelf 5 are provided at different positions along the path longitudinal direction Y. Further, the second supporting position P2 in the container transfer section 4 and the position in the storage shelf 5 for supporting the substrate storage container 9 are set on a same side and at a same distance in the path lateral width direction X relative to the traveling rail 2.

[Container Transfer Section]

As shown in FIGS. 2-4, the container transfer section 4 is disposed on the floor side in close vicinity of the processing device 3. In the container transfer section 4, there are set the first supporting position P1 for receiving the substrate storage container 9 from the ceiling transport carriage 1, the second supporting position P2 for transferring the substrate storage container 9 to the ceiling transport carriage 1, and a processing position P3 for causing the processing device 3 to effect a prescribed process or operation on the substrate storage container 9 ("prescribed process"). These positions, i.e. the first supporting position P1, the second supporting position P3 and the processing position P3 are set, in the container transfer section 4, in tandem on a single straight line along the path lateral width direction X. And, the first supporting position P1 is set between the processing position P3 and the second supporting position P2. Further, an arrangement is provided such that when the substrate storage container 9 is located at the processing position P3, the processing device 3 opens/closes the lid 11 of this substrate storage container 9 and carries in/out the substrates 8 to/from the substrate storage container 9 therethrough. In this way, the processing position P3 is provided at a position for causing the processing device 3 to effect opening/closing operations and carry in/out operations.

And, the first supporting position P1 and the processing position P3 are set to be overlapped with the substrate storage container 9 along the path lateral width direction X (as viewed in the direction aligned with the hoisting direction Z and the path longitudinal direction Y) when the substrate storage container 9 is disposed at the first supporting position P1 and the processing position P3. In the above, the language "overlapped" means that overlapping with a portion or all of the substrate storage container 9 when disposed at these positions (P1 and P3). The above-described setting of the first supporting position P1 and the processing position P3 aims at achieving size reduction of the container transfer section 4 along the path lateral width direction X. Incidentally, in the above, there was disclosed the exemplary arrangement of overlapping as viewed in the direction aligned with the hoisting direction Z and the path longitudinal direction Y. However, the size of the container transfer section 4 along the path lateral width direction X can be restricted as long as the two positions (P1, P3) are set with overlapping at least when viewed along the hoisting direction Z.

Further, the first supporting position P1 and the second supporting position P2 are set to be not overlapped with the substrate storage container 9 along the path lateral width direction X (as viewed in the direction aligned with the hoisting direction Z and the path longitudinal direction Y) when the substrate storage container 9 is disposed at the first supporting position P1 and the second supporting position P2. In the above, the language "not overlapped" means that non-overlapping of even with a portion of the substrate storage container 9 when disposed at these positions (P1 and P2). With the above, when another substrate storage container 9 is mounted and supported at the second supporting position P2, a substrate storage container 9 can be received at the first supporting position P1 from the ceiling transport carriage 1. Incidentally, in the above, there was disclosed the exemplary arrangement of non-overlapping as viewed in the direction aligned with the hoisting direction Z and the path longitudinal direction Y. However, as long as the two positions (P1, P2) are set with non-overlapping at least when viewed along the hoisting direction Z, a substrate storage container 9 can be received at the first supporting position P1 from the ceiling transport carriage 1, when another substrate storage container 9 is mounted and supported at the second supporting position P2.

The container transfer section 4 includes the ground transport device 6 for transporting the substrate storage container 9 between the first supporting position P1, the second supporting position P2 and the processing position P3. This ground transport device 6 includes a processing-side transport deck 23 which mounts and supports a portion of the bottom face of the substrate storage container 9 and moves under this condition along the path lateral width direction X for transporting the substrate storage container 9 between the processing position P3 and the first supporting position P1 and a transferring-side transport deck 24 which mounts and supports thereon another portion of the bottom face of the substrate storage container 9 not mounted or supported by the processing-side transport deck 23 and moves under this condition along the path lateral width direction X for transporting the substrate storage container 9 between the first supporting position P1 and the second supporting position P2. As the processing-side transport deck 23 and the transferring-side transport deck 24 are moved vertically relative to each other, the substrate storage container 9 can be transferred between the processing-side transport deck 23 and the transferring-side transport deck 24.

Figure 6A:
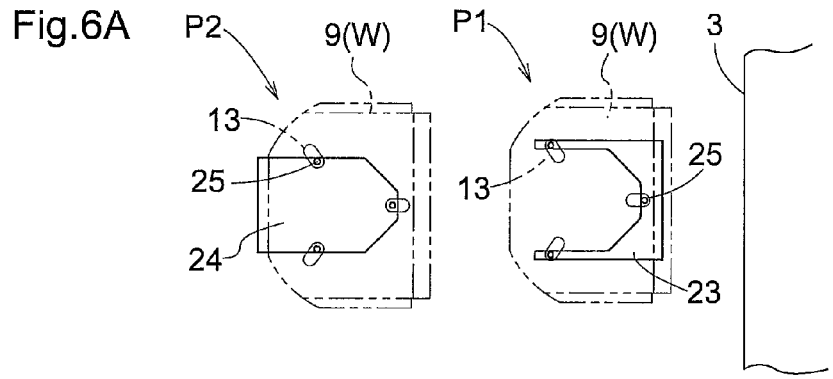
FIGS. 6A-6D are plan views illustrating the article transport functions.

Referring more particularly to the ground transport device 6, as shown in FIG. 6A, etc., the processing-side transport deck 23 has a shape comprising a rectangular shape with a portion thereof cutout. The transferring-side transport deck 24 has a shape which is confined within the above-described "cutout" of the processing-side transport deck 23 when the processing-side transport deck 23 and the transferring-side transport deck 24 are located at the first supporting position P1. With this, the transferring-side transport deck 24 is capable of mounting and supporting the portion of the bottom face of the substrate storage container 9 which portion is not mounted or supported by the processing-side transport deck 23, as described above. Further, in the periphery of the cutout of the processing-side transport deck 23 and in the outer peripheral edge of the transferring-side transport deck 24, positioning projections 25 in the form of kinematic pins are provided at three positions for coming into engagement with the engaged portions 13 of the substrate storage container 9. As these positioning projections 25 engageable with the engaged portions 13 of the substrate storage container 9 come into actual engagement with the engaged portions 13 of the substrate storage container 9, the substrate storage container 9 is fixed in position at the prescribed positions on the respective transport decks 23, 24.

As shown in FIGS. 5A-5D and FIGS. 6A-6D, the ground transport device 6 mounts the processing-side transport deck 23, with this deck 23 being horizontally movable to the first supporting position P1 and the processing position P3. When the processing-side transport deck 23 is moved from the first supporting position P1 to the processing position P3, the substrate storage container 9 as being mounted and supported by this processing-side transport deck 23 is transported from the first supporting position P1 to the processing position P3. Further, when the processing-side transport deck 23 is moved from the processing position P3 to the first supporting position P1, the substrate storage container 9 as being mounted and supported by the processing-side transport deck 23 is transported from the processing position P3 to the first supporting position P1.

Further, the ground transport device 6 mounts the transferring-side transport deck 24, with the deck 24 being horizontally movable to the first supporting position P1 and the second supporting position P2. As the transferring-side transport deck 24 is moved from the first supporting position P1 to the second supporting position P2, the substrate storage container 9 as being mounted and supported by this transferring-side transport deck 24 is transported from the first supporting position to the second supporting position P2.

And, the transferring-side transport deck 24 is configured to be hoistable, i.e. vertically movable. More particularly, when the processing-side transport deck 23 and the transferring-side transport deck 24 are located at the first supporting position P1, if the transferring-side transport deck 24 is moved upwards relative to the processing-side transport deck 23, the substrate storage container 9 can be transferred from the processing-side transport deck 23 to the transferring-side transport deck 24. That is, with the ground transport device 6 in operation, after the substrate storage container 9 is transported by the processing-side transport deck 23 from the processing position P3 to the first supporting position P1, the transferring-side transport deck 24 is moved up to transfer the substrate storage container 9 from the processing-side transport deck 23 to the processing-side transport deck 24. Thereafter, the transferring-side transport deck 24 transports this substrate storage container 9 from the first supporting position P1 to the second supporting position P2, whereby the substrate storage container 9 is transported from the processing position P3 to the second supporting position P2.

As shown in FIG. 2, the control device H effects controlling of the operations of the ground transport device 6, in addition controlling of the operations of the ceiling transport carriage 1 described above. As shown in FIGS. 5A-5D, with the control device H in operation for controlling the operations of the ceiling transport carriage 1 and the operations of the ground transport device 6, the ceiling transport carriage 1 is caused to transfer the substrate storage container 9 to the first supporting position P1, then, the ground transport device 6 is caused to transport this substrate storage container 9 from the first supporting position P1 to the processing position P3. Further, the ceiling transport carriage 1 is caused to receive the substrate storage container 9 at the second supporting position P2 and then, the ground transport device 6 is caused to transport the substrate storage container 9 after its processing at the processing position P3 from the processing position P3 to the second supporting position P2.

Next, there will be provided additional explanation respecting the controlling of the operations of the ceiling transport carriage 1 and the ground transport device 6 by the control device H in case the ceiling transport carriage 1 transfers the substrate storage container 9 to/from the container transfer section 4 while this substrate storage container 9 is supported by the transferring-side transport deck 24 located at the second supporting position P2 of the container transfer section 4.

Figure 5A:
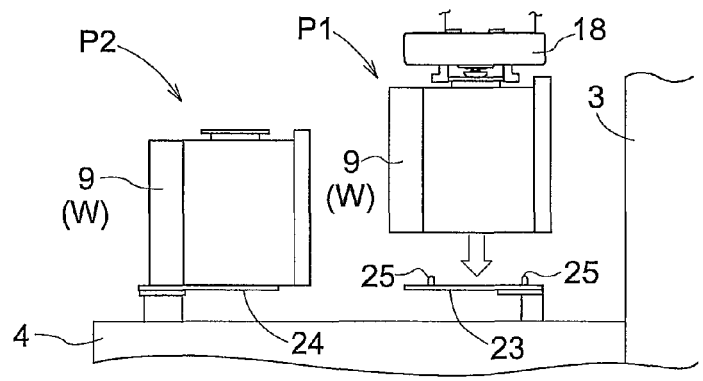
FIGS. 5A-5D are side views illustrating article transport functions.

Firstly, as illustrated in FIG. 5A, with execution of a transferring process, the substrate storage container 9 is transferred from the ceiling transport carriage 1 to the processing-side transport deck 23 located at the first supporting position P1. Thereafter, as illustrated in FIG. 5B, with execution of a receiving process, the ceiling transport carriage 1 is caused to receive the substrate storage container 9 on the transferring-side transport deck 24 located at the second supporting position P2.

Figure 5B:
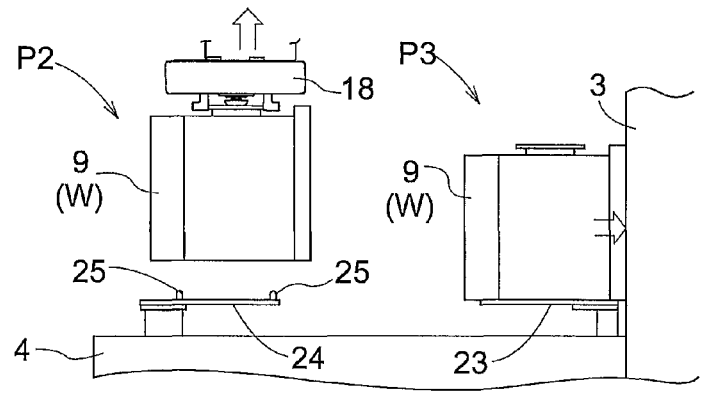
Figure 5C:
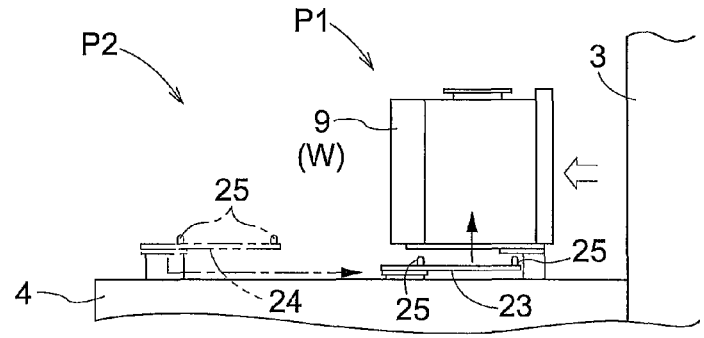
Figure 5D:
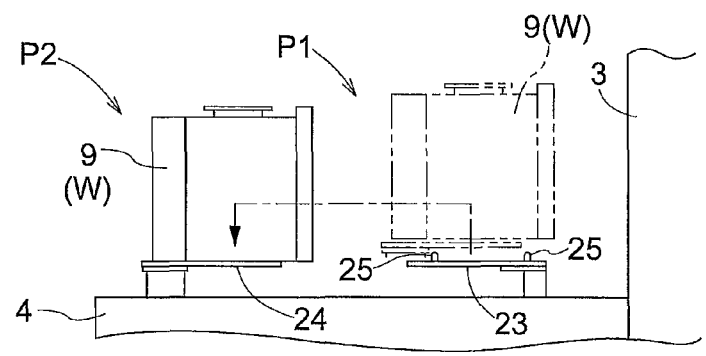
Figure 6B:
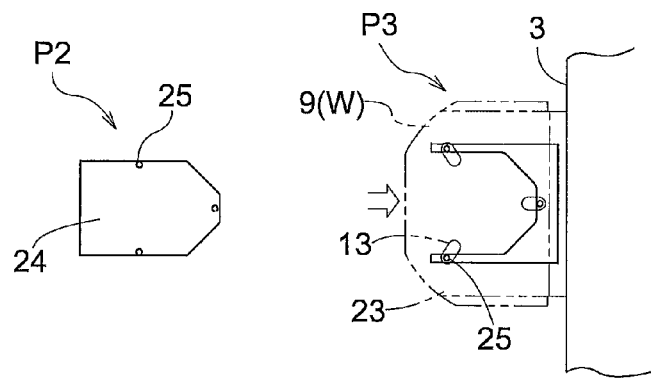
Figure 6C:
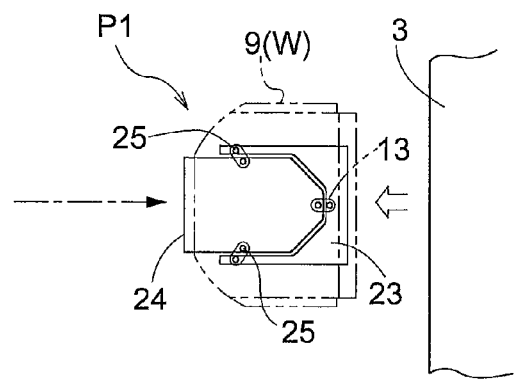
Figure 6D:
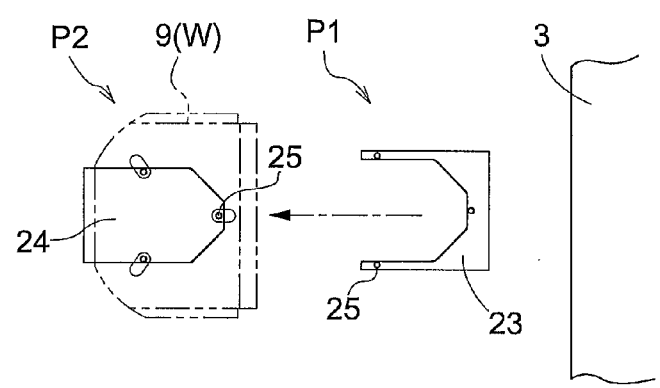

Then, during the execution of the transferring process after the transfer of the substrate storage container 9 onto the processing-side transport deck 23 (i.e. during taking-up of the take-up belt 19a) or during the execution of the receiving process subsequent thereto, as illustrated in FIG. 5B and FIG. 6B, the processing-side transport deck 23 is moved to move the substrate storage container 9 from the first supporting position P1 to the processing position P3. After completion of the processing ("prescribed processing") by the processing device 3 on the substrate storage container 9, as illustrated in FIG. 5C, FIG. 5D and FIG. 6C, FIG. 6D, the processing-side transport deck 23 and the processing-side transport deck 24 are moved to move the substrate storage container 9 from the processing position P3 to the second supporting position P2.

As described above, the ceiling transport carriage 1 includes the slide operating mechanism 20 for causing the support mechanism 18 to be moved along the path lateral width direction X to the position immediately above the first supporting position P1 and the position immediately above the second supporting position P2. Further, in the container transfer section 4, the first supporting position P1, the second supporting position P2 and the processing position P3 are set in tandem along the path lateral width direction X. With this, after the ceiling transport carriage 1 transfers the substrate storage container 9 to the container transfer section 4, this ceiling transport carriage 1 can receive the substrate storage container 9 from the storage transfer section 4 and at the same time, installment space for the container transfer section 4 can be readily secured even when the processing device 3 has a small dimension along the path longitudinal direction Y.

[Other Embodiments]

Figure 7:
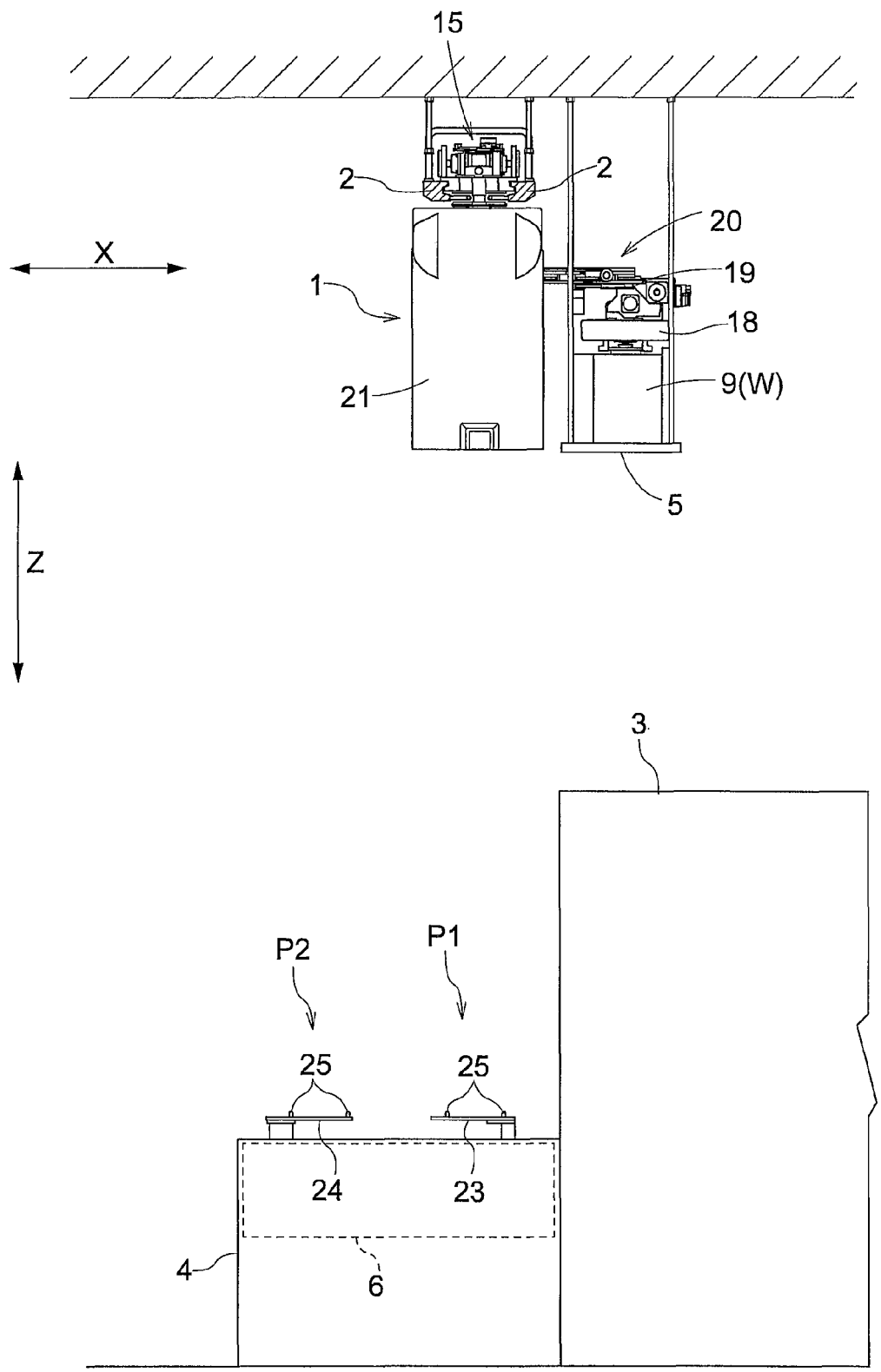
FIG. 7 is a front view showing a condition wherein a ceiling transport carriage transfers an article to/from a storage shelf in a further embodiment.

(1) In the foregoing embodiment, the storage shelf 5 was disposed on the same side as the second supporting position P2 relative to the traveling rail 2. However, as shown in FIG. 7, the storage shelf 5 can be disposed on the side different from that of the second supporting position P2 relative to the traveling rail 2. Further, the storage shelves 5 can be disposed on the both sides, i.e. the same side as the second supporting position P2 and the different side from the second supporting position P2. In this case, it will be advantageous if the slide operating mechanism 20 is configured to be capable of moving the supporting body 20a not only to the retracted position and the projecting position, but also to a projecting position on the other side. Here, the "projecting position on the other side" means a position for locating the support mechanism 18 and the substrate storage container 9 supported thereby on the other side along the path lateral width direction X relative to the traveling rail 2. Further alternatively, the storage shelf 5 may be disposed immediately above the traveling rail 2 and immediately below the article transfer section so as not to interfere with the transport of the article W by the ceiling transport carriage 1 or the transport of the article W by the ground transport device 6.

(2) In the foregoing embodiment, the processing-side transport deck 23 movable between the first supporting position P1 and the processing position P3 and the transferring-side transport deck 24 movable between the first supporting position P1 and the second supporting position P2 together constitute the ground transport device 6. However, it will suffice for this ground transport device 6 to include a support deck (the transferring-side transport deck 24 in the case of the foregoing embodiment) for supporting the article W located at the second supporting position P2 and a transport mechanism (the processing-side transport deck 23 and the transferring-side transport deck 24 in the case of the foregoing embodiment) capable of transporting the article W from the first supporting position P1 to the processing position P3 when the article W is present at the second supporting position P2 and capable also of transporting the article W from the processing position P3 to the second supporting position P2 when no article W is present at either the first supporting position P1 or the second supporting position P2. As a specific example of such alternative arrangement, the ground transport device 6 can be comprised of a fixed support deck disposed at the second supporting position P2 for mounting/supporting the article W and a transport deck capable of transporting the article W from the first supporting position P1 to the processing position P3 and capable also of transferring the article W from the processing position P3 onto the fixed support deck.

(3) In the foregoing embodiment, the traveling rail 2 was disposed immediately above the first supporting position P1. Instead, this traveling rail 2 can be disposed immediately above the second supporting position P2. Further alternatively, a pair of the traveling rails 2 can be disposed in parallel, immediately above the first supporting position P1 and immediately above the second supporting position P2, respectively.

(4) In the foregoing embodiment, the first supporting position P1 was set between the processing position P3 and the second supporting position P2. Instead, the processing position P3 and the first supporting position P1 can be set as being spaced apart from each other along the path lateral width direction X and the second supporting position P2 can be disposed between these positions, i.e. the processing position P3 and the first supporting position P1.

(5) In the foregoing embodiment, a plurality of article transfer sections were disposed in tandem along the path longitudinal direction Y, with provision of a plurality of article transfer sections for the processing device 3 (article processing device). Instead, a plurality of article processing devices can be disposed in tandem along the path longitudinal direction Y and for each one of these article processing devices, an article transfer section may be provided, such that a plurality of article transfer sections may be provided along the path longitudinal direction. Further alternatively, instead of providing a plurality of article transfer sections in tandem along the path longitudinal direction Y, a plurality of article transfer sections may be provided in distribution relative to the path longitudinal direction Y. Incidentally, in case a single article transfer section is to be disposed, even when the installment space of this article transfer section is limited within the width of the article processing device along the path longitudinal direction, the installment space for the article transfer section can be easily secured.

SIGNS 1 ceiling transport carriage
2 traveling rail
3 processing device (article processing device)
4 container transfer section (article transfer section)
8 substrate
9 substrate storage container
11 lid
18 support mechanism (support unit)
20 slide operating mechanism (movement operating mechanism)
23 processing-side transport deck
24 transferring-side transport deck
P1 first supporting position
P2 second supporting position
P3 processing position
W article
X path lateral width direction
Y path longitudinal direction

The invention claimed is:

1. An article transport facility comprising:
a ceiling transport carriage that can travel along a traveling path while being guided and supported by a traveling rail disposed on the ceiling side, the ceiling transport carriage including a support unit hoistable with supporting an article;
an article transfer section provided on the floor side in the vicinity of an article processing device for effecting a prescribed process on the article;
the traveling path for the ceiling transport carriage being disposed, upwardly of the article transfer section, along a path longitudinal direction that intersects a tandem direction along which the article processing device and the article transfer section are disposed in tandem; the ceiling transport carriage transfers an article to a first supporting position of the article transfer section in association with a hoisting of the supporting unit and receives the article from a second supporting position of the article transfer section in association with a hoisting of the supporting unit; and a ground transport device for transporting the article between a processing position where the article processing device effects the processing on the article and the first supporting position as well as between the processing position and the second supporting position;

wherein the first supporting position, the second supporting position and the processing position are set in tandem along the tandem direction in the article transfer section; and the ceiling transport carriage includes a movement operating mechanism for operating movement of the support unit to a position immediately above the first supporting position and to a position immediately above the second supporting position, along the tandem direction.

2. The article transport facility according to claim 1, wherein a plurality of the article transfer sections are disposed in tandem along the path longitudinal direction.

3. The article transport facility according to claim 1, wherein the facility further comprises a controller for controlling operations of the ceiling transport carriage and the ground transport device;

the first supporting position is set between the processing position and the second supporting position along the tandem direction; and the controller controls the operation of the ceiling transport carriage and the ground transport device such that:

the ceiling transport carriage transfers an article to the first supporting position, after which the ground transport device transports this article from the first supporting position to the processing position and the ceiling transport carriage receives an article at the second supporting position, and after which the ground transport device transports an article after the processing thereof at the processing position from this processing position to the second supporting position.

4. The article transport facility according to claim 2, wherein the facility further comprises a controller for controlling operations of the ceiling transport carriage and the ground transport device;

the first supporting position is set between the processing position and the second supporting position along the tandem direction; and the controller controls the operation of the ceiling transport carriage and the ground transport device such that:

the ceiling transport carriage transfers an article to the first supporting position, after which the ground transport device transports this article from the first supporting position to the processing position and the ceiling transport carriage receives an article at the second supporting position, and after which the ground transport device transports an article after the processing thereof at the processing position from this processing position to the second supporting position.

5. The article transport facility according to claim 3, wherein the ground transport device includes a processing-side transport deck configured to mount and support thereon a portion of the bottom face of the article and to move under this condition along the tandem direction for transporting the article between the processing position and the first supporting position and a transferring-side transport deck configured to mount and support thereon another portion of the bottom face of the article not mounted or supported by the processing-side transport deck and to move under this condition along the tandem direction for transporting the article between the first supporting position and the second supporting position; and as the processing-side transport deck and the transferring-side transport deck are hoisted relative to each other, the article is transferred between the processing-side transport deck and the transferring-side transport deck.

6. The article transport facility according to claim 4, wherein the ground transport device includes a processing-side transport deck configured to mount and support thereon a portion of the bottom face of the article and to move under this condition along the tandem direction for transporting the article between the processing position and the first supporting position and a transferring-side transport deck configured to mount and support thereon another portion of the bottom face of the article not mounted or supported by the processing-side transport deck and to move under this condition along the tandem direction for transporting the article between the first supporting position and the second supporting position; and as the processing-side transport deck and the transferring-side transport deck are hoisted relative to each other, the article is transferred between the processing-side transport deck and the transferring-side transport deck.

7. The article transport facility according to claim 1, wherein the article comprises a substrate storage container capable of storing a plurality of substrates therein and having a detachable lid for closing a substrate carry in/out opening; and the processing position is a position for effecting an opening/closing operation of the lid of the substrate storage container and a carry in/out operation of the substrate relative to the substrate storage container.

8. The article transport facility according to claim 2, wherein the article comprises a substrate storage container capable of storing a plurality of substrates therein and having a detachable lid for closing a substrate carry in/out opening; and the processing position is a position for effecting an opening/closing operation of the lid of the substrate storage container and a carry in/out operation of the substrate relative to the substrate storage container.

9. The article transport facility according to claim 3, wherein the article comprises a substrate storage container capable of storing a plurality of substrates therein and having a detachable lid for closing a substrate carry in/out opening; and the processing position is a position for effecting an opening/closing operation of the lid of the substrate storage container and a carry in/out operation of the substrate relative to the substrate storage container.

10. The article transport facility according to claim 4, wherein the article comprises a substrate storage container capable of storing a plurality of substrates therein and having a detachable lid for closing a substrate carry in/out opening; and the processing position is a position for effecting an opening/closing operation of the lid of the substrate storage container and a carry in/out operation of the substrate relative to the substrate storage container.

11. The article transport facility according to claim 5, wherein the article comprises a substrate storage container capable of storing a plurality of substrates therein and having a detachable lid for closing a substrate carry in/out opening; and the processing position is a position for effecting an opening/closing operation of the lid of the substrate storage container and a carry in/out operation of the substrate relative to the substrate storage container.

12. The article transport facility according to claim 6, wherein the article comprises a substrate storage container capable of storing a plurality of substrates therein and having a detachable lid for closing a substrate carry in/out opening; and the processing position is a position for effecting an opening/closing operation of the lid of the substrate storage container and a carry in/out operation of the substrate relative to the substrate storage container.

\* \* \* \* \*